(12) United States Patent
Chen et al.

(10) Patent No.: US 11,736,073 B2
(45) Date of Patent: Aug. 22, 2023

(54) AMPLIFIER CIRCUIT AND CIRCUIT SYSTEM USING THE SAME

(71) Applicant: NUVOTON TECHNOLOGY CORPORATION, Hsinchu (TW)

(72) Inventors: Po-Sheng Chen, Hsinchu (TW); Cheng-Tao Li, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 7 days.

(21) Appl. No.: 17/674,144

(22) Filed: Feb. 17, 2022

(65) Prior Publication Data

US 2023/0043729 A1 Feb. 9, 2023

(30) Foreign Application Priority Data

Aug. 3, 2021 (TW) .................................. 110128591

(51) Int. Cl.
*H03F 3/04* (2006.01)
*H03F 3/45* (2006.01)

(52) U.S. Cl.
CPC ...................................... *H03F 3/04* (2013.01)

(58) Field of Classification Search
CPC .. H03F 3/04; H03F 2203/45636; H03F 3/303; H03F 3/45219
USPC ........................................... 330/252–261, 296
See application file for complete search history.

(56) References Cited

U.S. PATENT DOCUMENTS 10,199,007 B2 * 2/2019 Tsuchi .................... H03F 3/303

* cited by examiner

*Primary Examiner* — Hieu P Nguyen
(74) *Attorney, Agent, or Firm* — Muncy, Geissler, Olds & Lowe, P C.

(57) ABSTRACT

An amplifier circuit has an output stage, a first current source, a second current source, a third current source, a fourth current source, and a voltage clamping voltage. The output stage has a first P-type transistor and a first N-type transistor. The voltage clamping circuit receives a first bias voltage and a second bias voltage, and has a first end and a second end. When a second input current is positive current and the input current is a negative current or a zero current, the first end provides a first clamping voltage greater than the first bias voltage to a gate of the first P-type transistor. When the first input current is positive and the second input current is a negative current or zero current, the second end provides a second clamping voltage lower than the second bias voltage to a gate of the first N-type transistor.

20 Claims, 4 Drawing Sheets

AMPLIFIER CIRCUIT AND CIRCUIT SYSTEM USING THE SAME

CROSS-REFERENCE TO RELATED APPLICATION

This application claims the priority from the TW Patent Application No. 110128591, filed on Aug. 3, 2021, and all contents of such TW Patent Application are included in the present disclosure.

BACKGROUND

1. Technical Field

The present disclosure relates to an amplifier circuit, in particular to, an amplifier circuit which uses a voltage clamping circuit to achieve a high-speed and wide-voltage output behind an amplifying output stage.

2. Description of the Related Art

With the application of low voltage, high-speed and wide-voltage circuit requirements have become more and more common. For example, the common class AB amplifier has high-speed, full-voltage swing, strong driving capacity, and other advantages, so it is very suitable as an output stage. However, for general applications of wide-voltage circuit, high-speed operation of circuit becomes quite challenging due to the limitations of parasitic capacitance and slew rate.

In the amplifier circuit of the prior art, each of the voltage operation intervals of the gates of the P-type transistor and the N-type transistor of the class AB amplifier of the output stage is the interval between the ground voltage GND and the system voltage AVDD (including the two end values of the ground voltage GND and the system voltage AVDD). Therefore, it takes a longer time for the gate voltages of the P-type transistor and the N-type transistor of the class AB amplifier to reach the upper and lower limits of the above-mentioned voltage operation interval, resulting in being impossible to meet the requirements of the high-speed operation.

SUMMARY

According to the purpose of the present disclosure, an embodiment of the present disclosure provides an amplifier circuit. The amplifier comprises an output stage, a first current source, a second current source, a third current source, a fourth current source, and a voltage clamping circuit. The output stage comprises a first P-type transistor and a first N-type transistor, wherein the first P-type transistor is electrically connected to the first N-type transistor in series. The first current source is used to provide a first input current. The second current source is used to provide a first bias current. The third current source is used to provide a second input current. The fourth current source is used to provide a second bias current. The voltage clamping circuit receives a first bias voltage and a second bias voltage lower than the first bias voltage, and has a first end and a second end. The first end of the voltage clamping circuit is electrically connected to the first current source, the second current source and a gate of the first P-type transistor, and the second end of the voltage clamping circuit is electrically connected to the third current source, the fourth current source and a gate of the first N-type transistor. Wherein when the second input current is positive current and the first input current is a negative current or zero current, the first end of the voltage clamping circuit provides a first clamping voltage greater than the first bias voltage to the gate of the first P-type transistor. When the first input current is positive current and the second input current is negative current or zero current, the second end of the voltage clamping circuit provides a second clamping voltage lower than the second bias voltage to the gate of the first N-type transistor.

As stated above, the amplifier circuit of the embodiment of the present disclosure can achieve high-speed and broadband operation.

To further understand the technology, means, and effects of the present disclosure, reference may be made by the detailed description and drawing as follows. Accordingly, the purposes, features and concepts of the present disclosure can be thoroughly and concretely understood. However, the following detail description and drawings are only used to reference and illustrate the implementation of the present disclosure, and they are not used to limit the present disclosure.

BRIEF DESCRIPTION OF THE DRAWINGS

Reference will now be made in detail to exemplary embodiments of the present disclosure, which will be illustrated in the accompanying drawings. In possible case, the same reference symbols are used in the drawings and the description to refer to the same or similar components. In addition, the method of the exemplary embodiments is only one of the realization methods of the design concept of the present disclosure, and the following examples are not intended to limit the present disclosure.

DESCRIPTION OF THE PREFERRED EMBODIMENTS

Figure 1:
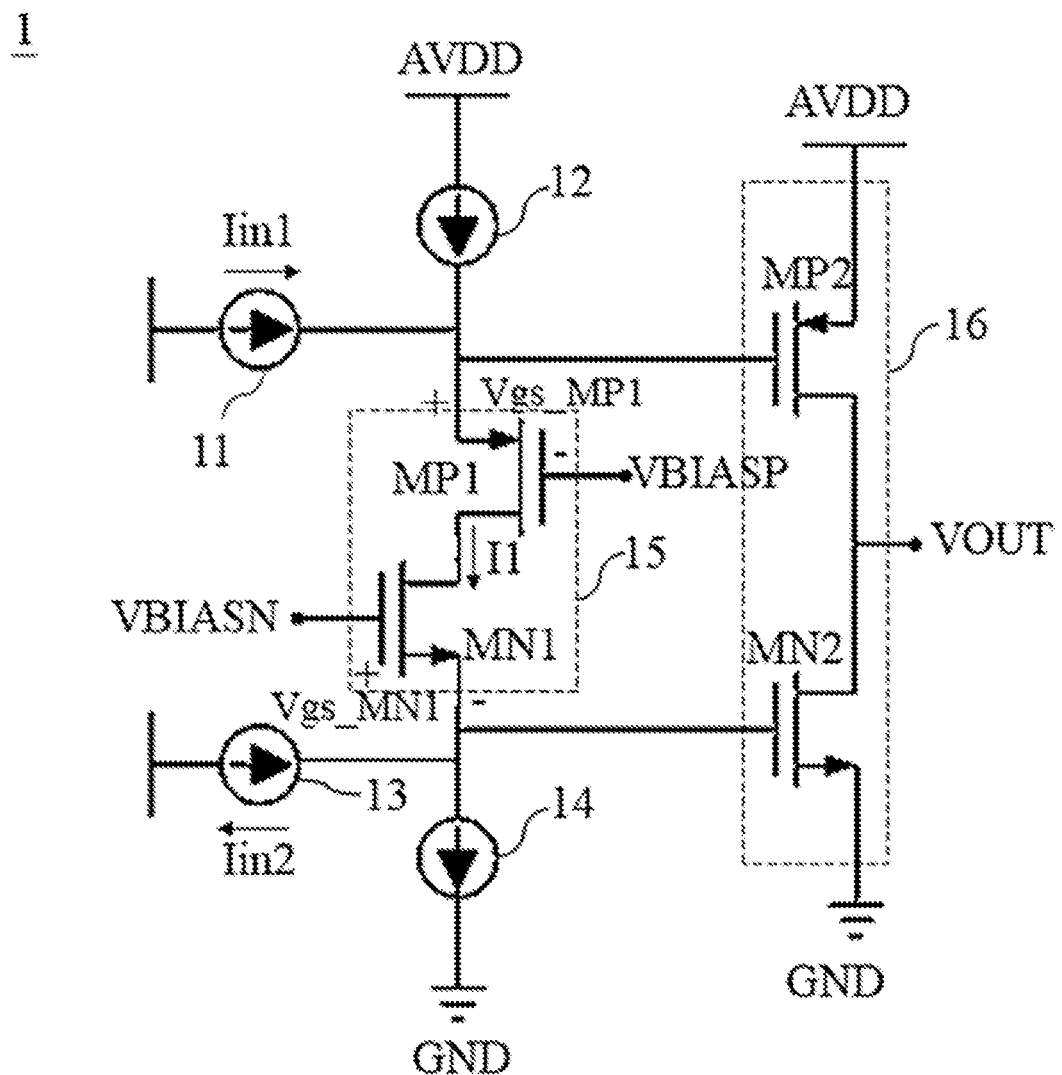
FIG. 1 is a circuit diagram of an amplifier circuit according to an embodiment of the present disclosure.

The embodiments of the present disclosure are described in detail as reference, and the drawings of the present disclosure are illustrated. In the case of possibility, the element symbols are used in the drawings to refer to the same or similar components. In addition, the embodiment is only one approach of the implementation of the design concept of the present disclosure, and the following multiple embodiments are not intended to limit the present disclosure.

An embodiment of the present disclosure provides an amplifier circuit, which mainly limits the voltage operation intervals of the gates of the P-type transistor and the N-type transistor of the class AB amplifier of the output stage through the voltage clamping circuit. It makes that the voltage operation interval of the gate of the P-type transistor of the class AB amplifier is the interval between the first clamping voltage and the system voltage AVDD (including the two end values of the first clamping voltage and the system voltage AVDD). Further, it makes that the voltage operation interval of the gate of the N-type transistor of the class AB amplifier is the interval between the ground voltage GND and the second clamping voltage (including the two end values of the ground voltage GND and the second clamping voltage). The first clamping voltage is greater than the first bias voltage VBIASP, the second clamping voltage is lower than the second bias voltage VBIASN, the first bias voltage VBIASP is greater than the second bias voltage VBIASN, and the first bias voltage VBIASP and the second bias voltage VBIASN are greater than the ground voltage GND and lower than the system voltage AVDD. For example, the first clamping voltage is the first bias voltage VBIASP plus the gate-source voltage Vgs_MP1 of the P-type shielding transistor, and the second clamping voltage is the second bias voltage VBIASN minus the gate-source voltage Vgs_MN1 of the N-type shielding transistor. In this way, the P-type transistor and the N-type transistor of the class AB amplifier can reach upper and lower limits of the above-mentioned voltage operation intervals (for example, the upper and lower limits are defined by the user) more quickly. As a result, it can increase operation speed and realize broadband operation. Additionally, the above-mentioned P-type shielding transistor and N-type shielding transistor can be any type of P-type transistor and N-type transistor. The word "shielding" only describes that its function is to pull up the first bias voltage and pull down the second bias voltage to achieve a similar effect of shielding the first bias voltage and the second bias voltage.

Referring to FIG. 1, which is a circuit diagram of an amplifier circuit according to an embodiment of the present disclosure. An amplifier circuit 1 comprises a first current source 11, a second current source 12, a third current source 13, a fourth current source 14, a voltage clamping circuit 15 and an output stage 16. The output stage 16 comprises a P-type transistor MP2 and a N-type transistor MN2. A source of the P-type transistor MP2 is electrically connected to a system voltage AVDD. A drain of the P-type transistor MP2 and a drain of the N-type transistor MN2 are electrically connected to each other. A source of the N-type transistor MN2 is electrically connected to a ground voltage GND. As well, a gate of the P-type transistor MP2 is electrically connected to a first clamping voltage provided by a first end of the voltage clamping circuit 15, and a gate of the N-type transistor MN2 is electrically connected to a second clamping voltage provided by a second end of the voltage clamping circuit 15. The first end of the voltage clamping circuit 15 is electrically connected to the first current source 11 and the second current source 12, and the second end of the voltage clamping circuit 15 is electrically connected to the third current source 13 and the fourth current source 14.

The second current source 12 is used to provide a first bias current to the first end of the voltage clamping circuit 15, and the fourth current source 14 is used to provide a second bias current to the second end of the voltage clamping circuit 15. As well, the first current source 11 is used to provide a first input current Iin1 to the first end of the voltage clamping circuit 15, and the third current source 13 is used to provide a second input current Iin2 to the second end of the voltage clamping circuit 15. The first input current Iin1 and the second input current Iin2 are mutually reverse currents. Alternatively, one of the first input current Iin1 and the second input current Iin2 is positive current, and the other is zero current.

When the first input current Iin1 is a positive current, the second input current Iin2 is a negative current (or zero current) and lower than the second bias current, and a current I1 of the voltage clamping circuit 15 is greater than zero, the gate of the P-type transistor MP2 is closed to the system voltage AVDD, and the voltage of the gate of the N-type transistor MN2 is the second clamping voltage lower than the second bias voltage VBIASN (for example, the second bias voltage VBIANS minus the gate-source voltage Vgs_MN1 of the N-type shielding transistor), and an output voltage VOUT of the output stage 16 is the ground voltage GND.

When the first input current Iin1 is a negative current (or zero current) and lower than the first bias current, the second input current Iin2 is a positive current, and the current I1 of the voltage clamping circuit 15 is greater than zero, the gate of the N-type transistor MN2 is closed to the ground voltage GND, the voltage of the gate of the P-type transistor MP2 is the first clamping voltage greater than the first bias voltage VBIASP (for example, the first bias voltage VBIASP plus the gate-source voltage Vgs_MP1 of the P-type shielding transistor), and the output voltage VOUT of the output stage 16 is the system voltage AVDD.

The P-type transistor MP2 is electrically connected to the N-type transistor MN2 in series to form a class AB amplifier. By reducing the voltage operation intervals of the gates of the P-type transistor MP2 and the first N-type transistor MN2, the gate voltages of the of the N-type transistor MN2 and the first P-type transistor MP2 can more quickly reach the upper and lower limits of the predetermined voltage operation intervals, after statues of the first P-type transistor MP2 and the N-type transistor MN2 of the class AB amplifier are transited. In this way, the class AB amplifier of the output stage 16 can perform high-speed and broadband operation. Although, the implementation manner of the present disclosure is to maintain the gate voltages of the P-type transistor MP2 and the N-type transistor MN2, which sacrifices the quiescent currents of the gate of the P-type transistor MP2 and N-type transistor MN2, the power consumption is not increased obviously. Additionally, in the embodiment of the present disclosure, the amplifier circuit 1 is non-linear, so it can be applied to high-speed, broadband and non-linear amplified applications, for example, as a comparator.

Further, the voltage clamping circuit 15 can be implemented in multiple ways, as long as the voltage clamping circuit 15 can provide the first clamping voltage at the first end and the second clamping voltage the second end respectively, and the present disclosure is not limited thereto. In the embodiment of FIG. 1, the voltage clamping circuit 15 mainly comprises a P-type shielding transistor MP1 and an N-type shielding transistor MN1. A gate of the P-type shielding transistor MP1 is electrically connected to the first bias voltage VBIASP, and a gate of the N-type shielding transistor MN1 is electrically connected to the second bias voltage VBIASN. A drain of the P-type shielding transistor MP1 and a drain of the N-type shielding transistor MN1 are electrically connected to each other. A source of the P-type shielding transistor MP1 is electrically connected to the first current source 11, the second current source 12 and the gate of the P-type transistor MP2. As well, a source of the N-type shielding transistor MN1 is electrically connected to the third current source 13, the fourth current source 14 and the gate of the N-type transistor MN2. Hence, in the embodiment, the first clamping voltage is the first bias voltage VBIASP plus the gate-source voltage Vgs_MP1 of the P-type shielding transistor MP1, and the second clamping voltage is the second bias voltage VBIASN minus the gate-source voltage Vgs_MN1 of the N-type shielding transistor MN1.

In another embodiment, the voltage clamping circuit 15 comprises a buck voltage regulator and a boost voltage regulator. An input end of the boost voltage regulator receives the first bias voltage VBIASP, and an output end of the boost voltage regulator is used to provide the first clamping voltage greater than the first bias voltage VBIASP. An input end of the buck voltage regulator receives the second bias voltage VBIASN, and an output end of the buck voltage regulator is used to provide the second clamping voltage lower than the second bias voltage VBIASN. Please note here that the above-mentioned voltage clamping voltage circuit 15 is one of the embodiments of the present disclosure, but other circuit combinations which have the above similar function can also be used to implement the present disclosure.

Figure 2:
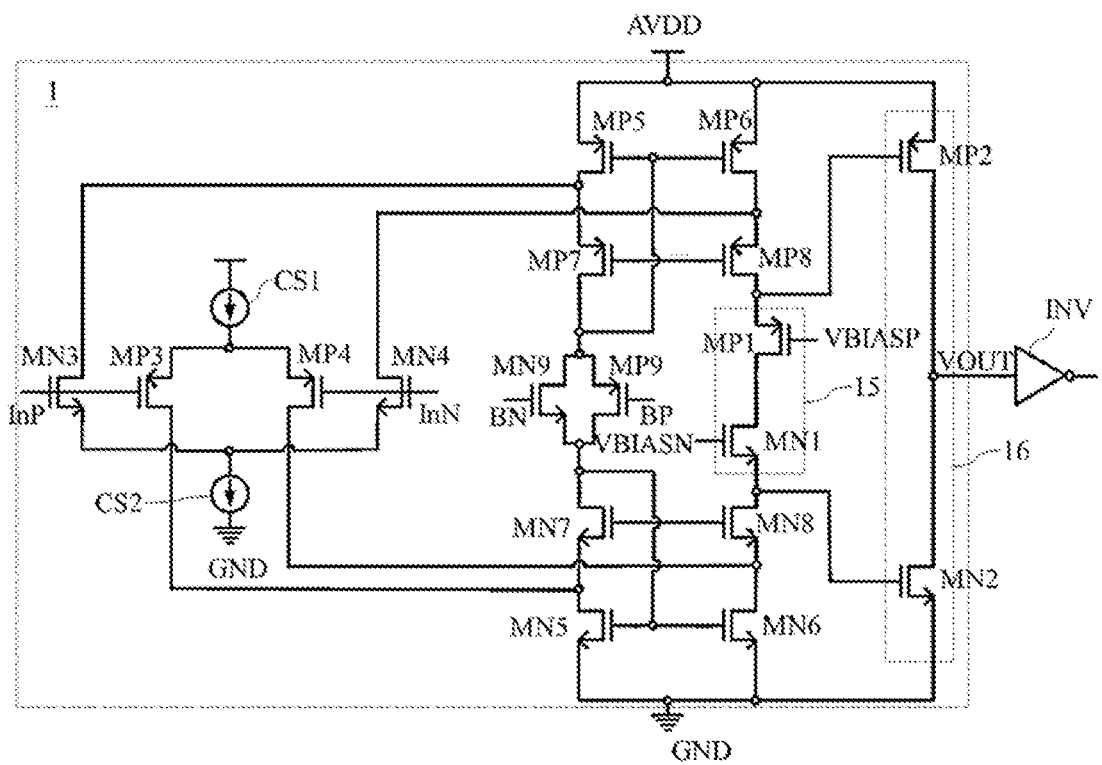
FIG. 2 is a circuit diagram of an amplifier circuit according to another embodiment of the present disclosure.

Referring to FIG. 2, which is a circuit diagram of an amplifier circuit according to another embodiment of the present disclosure. In FIG. 2, the details of the first current source 11, the second current source 12, the third current source 13 and the fourth current source 14 in FIG. 1 are further depicted. Moreover, the output stage 16 can be further electrically connected to an inverter INV to serve as a buffer element of the output voltage VOUT. The P-type transistors MP5 to MP9 are configured as the second current source 12 to provide the first bias current. The N-type transistors MN5 to MN9 are configured as the fourth current source 14 to provide the second bias current. A reference current source CS2, the N-type transistors MN3 and MN4 are configured as the first current source 11 to provide the first input current Iin1, wherein the first current source 11 is electrically connected to the gate of the P-type transistor MP2 through the P-type transistor MP8. The reference current source CS1, the P-type transistors MP3 and MP4 are configured as the third current source 13 to provide a second input current Iin2, wherein the second current source 12 is electrically connected to the gate of the N-type transistor MN2 through the N-type transistor MN8.

Furthermore, the reference current source CS1 is electrically connected to the sources of the P-type transistors MP3 and MP4. The gate of the P-type transistor MP3 is electrically connected to an input signal InP, and the gate of the P-type transistor MP4 is electrically connected to an input signal InN. Further, the drain of the P-type transistor MP3 is electrically connected to the source of the N-type transistor MN7, and the drain of the P-type transistor MP4 is electrically connected to the source of the N-type transistor MN8. The reference current source CS2 is electrically connected to the sources of the N-type transistors MN3 and MN4. The gate of the N-type transistor MN3 is electrically connected to the input signal InP, and the gate of the N-type transistor MN4 is electrically connected to the input signal InN. The drain of the N-type transistor MN3 is electrically connected to the source of the P-type transistor MP7, and the drain of the N-type transistor MN4 is electrically connected to the source of the P-type transistor MP8.

The sources of the P-type transistors MP5 and MP6 are electrically connected to the system voltage AVDD. The gates of the P-type transistors MP5 and MP6 are electrically connected to each other, which is electrically connected to the drain of the P-type transistor MP7. As well, the drain of the P-type transistor MP5 is electrically connected to the source of the P-type transistor MP7, and the drain of the P-type transistor MP6 is electrically connected to the source of the P-type transistor MP8. The gates of the P-type transistors MP7 and MP8 are electrically connected to each other. As well, the drain of the P-type transistor MP7 is electrically connected to the source of the P-type transistor MP9, and the drain of the P-type transistor MP8 is electrically connected to the first end of the voltage clamping circuit 15. Further, the gate of the P-type transistor MP9 receives a bias voltage BP, and the drain of the P-type transistor MP9 is electrically connected to the drain of the N-type transistor MN7.

The sources of the N-type transistors MN5 and MN6 are electrically connected to the ground voltage GND. The gates of the N-type transistors MN5 and MN6 are electrically connected to each other, which is electrically connected to the drain of the N-type transistor MN7. As well, the drain of the N-type transistor MN5 is electrically connected to the source of the N-type transistor MN7, and the drain of the N-type transistor MN6 is electrically connected to the source of the N-type transistor MN8. The gates of the N-type transistors MN7 and MN8 are electrically connected to each other. Further, the drain of the N-type transistor MN7 is electrically connected to the source of the N-type transistor MN9, and the drain of the N-type transistor MN8 is electrically connected to the second end of the voltage clamping circuit 15. The gate of the N-type transistor MN9 receives a bias voltage BN, and the drain of the N-type transistor MN9 is electrically connected to the drain of the P-type transistor MP7.

Figure 3A:
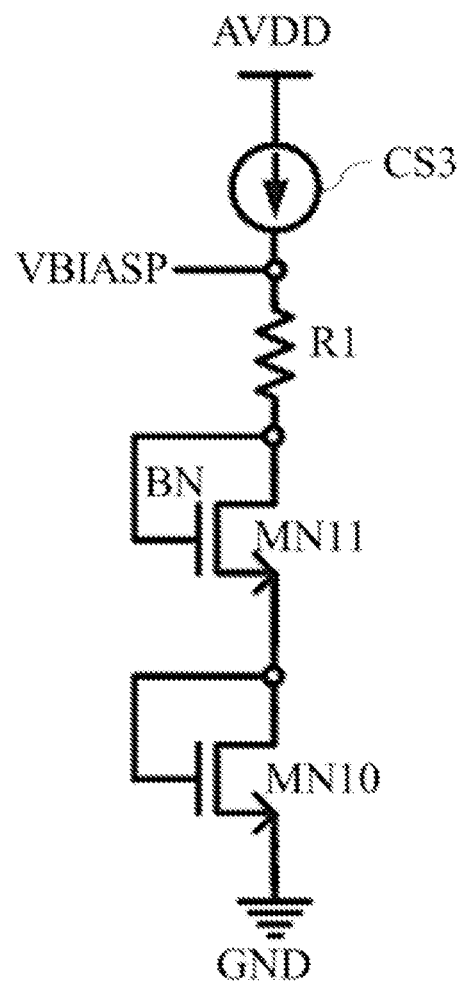
FIG. 3A is a circuit diagram of a first bias voltage generator of the amplifier circuit according to an embodiment of the present disclosure.

Referring to FIG. 3A, which is a circuit diagram of a first bias generator of the amplifier circuit according to the embodiment of the present disclosure. The amplifier circuit 1 further comprises a first bias voltage generator, and the first bias voltage VBIASP and the bias voltage BN are generated by the first bias voltage generator. The first bias voltage generator comprises the N-type transistors MN10, MN11, a resistor R1, and the reference current source CS3. The source of the N-type transistor MN10 is electrically connected to the ground voltage GND. The gate of the N-type transistor MN10 is electrically connected to the drain of the N-type transistor MN10. As well, the drain of the N-type transistor MN10 is electrically connected to a source of the N-type transistor MN11. The gate of the N-type transistor MN11 is electrically connected to the drain of the N-type transistor MN11 and provides the bias voltage BN. An end of the resistor R1 is electrically connected to the drain of the N-type transistor MN10, and the other end of the resistor R1 is electrically connected to the reference current source CS3 and provides the first bias voltage VBIASP.

Figure 3B:
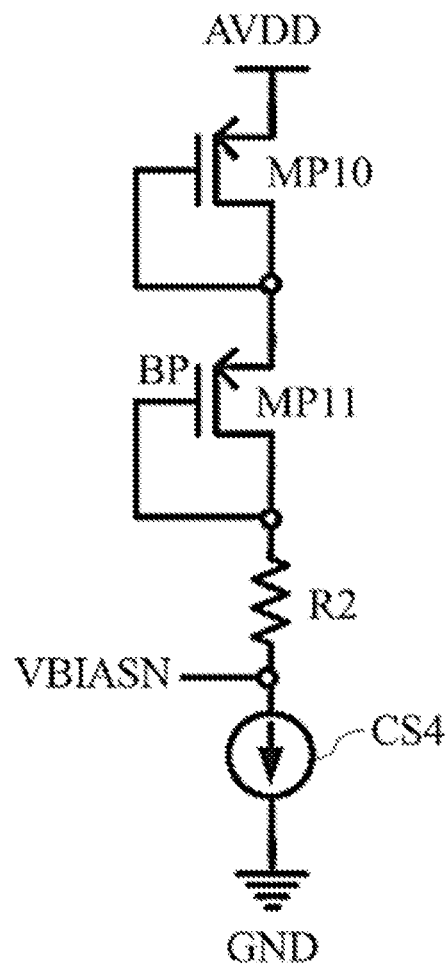
FIG. 3B is a circuit diagram of a second bias voltage generator of the amplifier circuit according to an embodiment of the present disclosure.

Referring to FIG. 3B, which is a circuit diagram of a second bias generator of the amplifier circuit according to the embodiment of the present disclosure. The amplifier circuit 1 further comprises a second bias voltage generator, and the second bias voltage VBIASN and the bias voltage BP are generated by the second bias voltage generator. The second bias voltage generator comprises the P-type transistors MP10, MP11, a resistor R2 and the reference current source CS4. The source of the P-type transistor MP10 is electrically connected to the system voltage AVDD. The gate of the P-type transistor MP10 is electrically connected to the drain of the P-type transistor MP10. As well, the drain of the P-type transistor MP10 is electrically connected to the source of the P-type transistor MP11. The gate of the P-type transistor MP11 is electrically connected to the drain of the P-type transistor MP11 and provides the bias voltage BP. An end of the resistor R2 is electrically connected to the drain of the P-type transistor MP10, and the other end of the resistor R2 is electrically connected to the reference current source CS4 and provides the second bias voltage VBIASN.

In another embodiment of the present disclosure, a circuit system is provided. The circuit system comprises a load and the amplifier circuit of the present disclosure mentioned above. The load is electrically connected to the output stage 16 of the amplifier circuit 1. Additionally, the circuit system can be applied to a speaker example, and the application of the present disclosure is not limited by this.

As stated above, in the present disclosure, the voltage operation interval of the gates of the P-type transistor and the N-type transistor of the class AB of the output stage is limited by providing the voltage clamping circuit. As a result, when the gates of the P-type transistor and the N-type transistor are transformed, the voltage operation interval can be maintained at the first clamping voltage and the second clamping voltage respectively. Hence, the gate voltages of the P-type transistor and the N-type transistor of the output stage are increased the speed for reaching the upper and lower limits of the predetermined voltage operation interval. Therefore, the amplifier circuit of the embodiment of the present disclosure can achieve high-speed and broadband operation.

It should be understood that the examples and embodiments described herein are for illustrative purpose only, and various modifications or changes in view thereof will be suggested to those skilled in the art, and will be included in the spirit and scope of the application and the appended within the scope of the claims.

What is claimed is:

1. An amplifier circuit, comprising:
   an output stage, comprising a first P-type transistor and a first N-type transistor, wherein the first P-type transistor is electrically connected to the first N-type transistor in series;
   a first current source, providing a first input current;
   a second current source, providing a first bias current;
   a third current source, providing a second input current;
   a fourth current source, providing a second bias current; and
   a voltage clamping circuit, receiving a first bias voltage and a second bias voltage lower than the first bias voltage, and having a first end and a second end, wherein the first end is electrically connected to the first current source, the second current source and a gate of the first P-type transistor, and the second end is electrically connected to the third current source, the fourth current source and a gate of the first N-type transistor;
   wherein when the second input current is a positive current and the first input current is a negative current or zero current, the first end provides a first clamping voltage greater than the first bias voltage to the gate of the first P-type transistor, when the first input current is positive current and the second input current is negative current or zero current, the second end provides a second clamping voltage lower than the second bias voltage to the gate of the first N-type transistor.

2. The amplifier circuit according to claim 1, wherein the voltage clamping circuit comprises:
   a P-type shielding transistor and a N-type shielding transistor;
   wherein a gate of the P-type shielding transistor is electrically connected to the first bias voltage, a gate of the N-type shielding transistor is electrically connected to the second bias voltage, a drain of the P-type shielding transistor is electrically connected to a drain of the N-type shielding transistor, a source of the P-type shielding transistor is electrically connected to the first current source, the second current source and the gate of the first P-type transistor, and a source of the N-type shielding transistor is electrically connected to the third current source, the fourth current source, and the gate of the first N-type transistor.

3. The amplifier circuit according to claim 2, wherein the first clamping voltage is the first bias voltage plus a gate-source voltage of the P-type shielding transistor.

4. The amplifier circuit according to claim 2, wherein the second clamping voltage is the second bias voltage minus a gate-source voltage of the N-type shielding transistor.

5. The amplifier circuit according to claim 1, further comprising:
   a first bias voltage generator, providing to generate the first bias voltage.

6. The amplifier circuit according to claim 1, further comprising:
   a second bias voltage generator, providing to generate the second bias voltage.

7. The amplifier circuit according to claim 1, wherein the first current source comprises a first reference current source and a plurality of second N-type transistors, wherein gates of the plurality of second N-type transistors respectively receive a first input signal and a second input signal, sources of the plurality of second N-type transistors are electrically connected to the first reference current sources, and drains of the plurality of second N-type transistors are electrically connected to the gate of the first P-type transistor.

8. The amplifier circuit according to claim 1, wherein the third current source comprises a second reference current source and a plurality of second P-type transistors, wherein gates of the plurality of second P-type transistors respectively receive a first input signal and a second input signal, sources of the plurality of second P-type transistors are electrically connected to the second reference current source, and drains of the plurality of second P-type transistors are connected to the gate of the first N-type transistor.

9. The amplifier circuit according to claim 7, wherein the second current source comprises a plurality of third P-type transistors which are electrically connected to each other, and the first current source is electrically connected to the gate of the first P-type transistor through one of the third P-type transistors.

10. The amplifier circuit according to claim 8, wherein the fourth current source comprises a plurality of third N-type transistors which are electrically connected to each other, and the second current source is electrically connected to the gate of the first N-type transistor through one of the third N-type transistors.

11. A circuit system, comprising:
    a load, electrically connected to an output stage of an amplifier circuit; and
    the amplifier circuit, comprising:
    the output stage, comprising a first P-type transistor and a first N-type transistor, wherein the first P-type transistor is electrically connected to the first N-type transistor in series;
    a first current source, providing a first input current;
    a second current source, providing a first bias current;
    a third current source, providing a second input current;
    a fourth current source, providing a second bias current; and
    a voltage clamping circuit, receiving a first bias voltage and a second bias voltage lower than the first bias voltage, and having a first end and a second end, wherein the first end is electrically connected to the first current source, the second current source and a gate of the first P-type transistor, and the second end is electrically connected to the third current source, the fourth current source and a gate of the first N-type transistor;

wherein when the second input current is a positive current and the first input current is a negative current or zero current, the first end provides a first clamping voltage greater than the first bias voltage to the gate of the first P-type transistor, when the first input current is positive current and the second input current is negative current or zero current, the second end provides a second clamping voltage lower than the second bias voltage to the gate of the first N-type transistor.

12. The circuit system according to claim 11, wherein the voltage clamping circuit comprises:
a P-type shielding transistor and a N-type shielding transistor;
wherein a gate of the P-type shielding transistor is electrically connected to the first bias voltage, a gate of the N-type shielding transistor is electrically connected to the second bias voltage, a drain of the P-type shielding transistor is electrically connected to a drain of the N-type shielding transistor, a source of the P-type shielding transistor is electrically connected to the first current source, the second current source and the gate of the first P-type transistor, and a source of the N-type shielding transistor is electrically connected to the third current source, the fourth current source, and the gate of the first N-type transistor.

13. The circuit system according to claim 12, wherein the first clamping voltage is the first bias voltage plus a gate-source voltage of the P-type shielding transistor.

14. The circuit system according to claim 12, wherein the second clamping voltage is the second bias voltage minus a gate-source voltage of the N-type shielding transistor.

15. The circuit system according to claim 11, wherein the amplifier circuit further comprises:
a first bias voltage generator, providing to generate the first bias voltage.

16. The circuit system according to claim 11, wherein the amplifier circuit further comprises:
a second bias voltage generator, providing to generate the second bias voltage.

17. The circuit system according to claim 11, wherein the first current source comprises a first reference current source and a plurality of second N-type transistors, wherein gates of the plurality of second N-type transistors respectively receive a first input signal and a second input signal, the sources of the plurality of second N-type transistors are electrically connected to the first reference current sources, and drains of the plurality of second N-type transistors are electrically connected to the gate of the first P-type transistor.

18. The circuit system according to claim 11, wherein the third current source comprises a second reference current source and a plurality of second P-type transistors, wherein gates of the plurality of second P-type transistors respectively receive a first input signal and a second input signal, sources of the plurality of second P-type transistors are electrically connected to the second reference current source, and drains of the plurality of second P-type transistors are connected to the gate of the first N-type transistor.

19. The circuit system according to claim 17, wherein the second current source comprises a plurality of third P-type transistors which are electrically connected to each other, and the first current source is electrically connected to the gate of the first P-type transistor through one of the third P-type transistors.

20. The circuit system t according to claim 18, wherein the fourth current source comprises a plurality of third N-type transistors which are electrically connected to each other, and the second current source is electrically connected to the gate of the first N-type transistor through one of the third N-type transistors.

* * * * *